United States Patent [19]

Dietrich

[11] Patent Number: 4,589,098

[45] Date of Patent: May 13, 1986

[54] METHOD AND APPARATUS FOR OPTICAL DATA PROCESSING

[75] Inventor: Klaus Dietrich, Gauting, Fed. Rep. of Germany

[73] Assignee: Messerschmitt-Bölkow-Blohm GmbH, Fed. Rep. of Germany

[21] Appl. No.: 494,527

[22] Filed: May 13, 1983

[30] Foreign Application Priority Data

May 14, 1982 [DE] Fed. Rep. of Germany ....... 3218244

[51] Int. Cl.[4] .............................................. G11C 7/00

[52] U.S. Cl. .................................... 365/215; 365/108

[58] Field of Search ............... 365/106, 108, 183, 215, 365/234

[56] References Cited

U.S. PATENT DOCUMENTS 4,498,156 2/1985 Pizzarello ............................ 365/215

*Primary Examiner*—Joseph A. Popek

*Attorney, Agent, or Firm*—McGlew and Tuttle

[57] ABSTRACT

A method of optical data processing employs a modulable source of light which illuminates an optical assembly. A storage location selector is employed to apply a second modulating signal to an address selected storage location of a charge storage register. A charge storage register provides a selected storage cell with a potential of the modulating signal. After storing the predetermined potential variation in the charge storage register the potential of each cell is applied through an optical modulator to the photocell of a photodetector arrangement. The optical properties of each modular element is controlled through the potential of the associated cell of the charge storage resistor in a manner such that the intensity of the light falling on the photocell is a function of the total intensity incident on the optical assembly and also a function of the voltage applied in the respective modular element. The charges produced by the photocells of the photodetector arrangement are delivered by means of a disconnectable photocharge transfer gate to the charge storage locations of a CCD shift register where they are integrated. The apparatus comprises a modulable source of light in an optical assembly for carrying out the method. The optical assembly includes a storage location selector, a charge storage register including n cells for receiving the modulating signals of the storage location selector. Also included is a modulator arrangement including n modulator elements, a photodetector arrangement including n photocells and each photocell is associated with the modulator element in a manner such that the modulator element covers the entire service area of the photocell. The photocharge transfer gate includes an input for a control signal and an analog CCD shift register. It has an input for a timing signal. It also has an input for an analog signal and an output for an analog signal.

6 Claims, 1 Drawing Figure

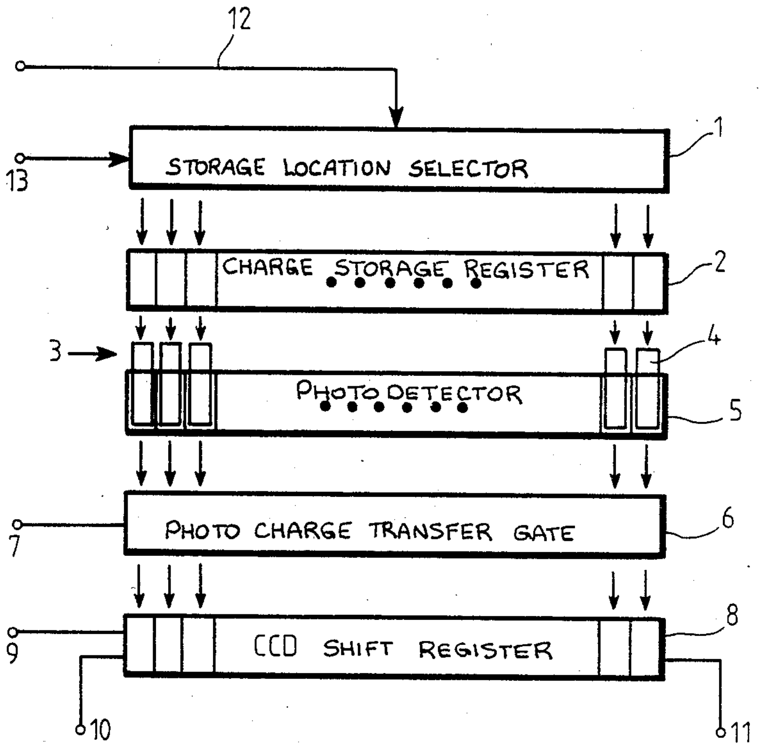
12
STORAGE LOCATION SELECTOR
1
13
CHARGE STORAGE REGISTER
2
3
4
PHOTO DETECTOR
5
PHOTO CHARGE TRANSFER GATE
6
7
CCD SHIFT REGISTER
8
9
10
11

METHOD AND APPARATUS FOR OPTICAL DATA PROCESSING

FIELD AND BACKGROUND OF THE INVENTION

The invention relates to a method of optical data processing, with a modulable source of light illuminating an optical assembly, and to a device for carrying out the method.

In such methods and devices, it is required, in particular, to optically perform various transformations, such as a folding, a correlation, a Fourier Transformation, etc.

A data processing method and device of this kind is described, for example, in the article "Electrooptical Signal Processing Module", by K. Bromey et al, SPIE Vol. 180 Real-Time Signal Processing II (1979). Provided is a two-dimensional photodetector arrangement which is illuminated through a mask by a module source of light, such as an LED. The mask is provided for each photocell of the photodector arrangement with a window of variable size. The size and distribution of these windows depends on the desired transformation. The image $f_n$ to be transformed with this method is serially scanned, whereby the intensity of the light radiated by the incoherent light source is modulated. Now, with this light, all the photocells of the photodetector arrangement, comprising charge-coupled storages (CCD) are simultaneously irradiated through the mask, with the photocharge produced per photocell in the CCD photodetector arrangement being a function of the light intensity and of the size of the windows of the mask.

As the light beam passes from one pixel of image $f_n$ to the next one, the total photodetector hitherto produced in the CCD photodetector arrangement is shifted by one storage location. With the image $f_n$ completely scanned, the photodetector arrangement contains a photocharge image corresponding to the transformation of image $f_n$ through the mask. This method may be applied to the transformation of both one- and two-dimensional data arrays $f_n$. Two-dimensional data arrays require a two-dimensional mask, as well as a two-dimensional photodetector arrangement. One-dimensional data strings $f_n$ require a one-dimensional mask and a one-dimensional, i.e. linear, photodetector arrangement.

This method and device are disadvantageous in that the mask must be positioned very accurately relative to the photodetector arrangement, and that the maximum positioning accuracy can be obtained only with the mask fixedly and directly applied to the photodetector arrangement. This deprives the device of its versatility, since a separate assembly is needed for every transformation, such as a Fourier transformation, or a correlation.

SUMMARY OF THE INVENTION

This invention is directed to a method eliminating the drawbacks mentioned above and which makes it possible to perform a plurality of transformations and which is versatile and inexpensive so as to be suitable for large-scale optical data processing. The invention is further directed to a device for carrying out the method, which is inexpensive, suitable for most applications and permit adjustment of the sensitivity of the individual photocells.

In accordance with the method of the invention, a second modulating signal is applied by means of a storage location selector to an address selected storage location of a charge storge register. In this selected storage cell a potential of the modulating signal is stored. The predetermined potential variation in the charge is stored in the storage register and the potential of each cell is applied through an optical modulator element to the photocell of a photodetector arrangement. The optical proterties of each modulator is controlled through the potential of the associated cell of the charge storage register in a manner such that the intensity of the light falling on the photocell is a function of the total intensity incident on the optical assembly and also a function of the voltage applied to the respective modulator element. The charges produced in the photocells of the photodetector arrangement are delivered by means of a disconnectable photocharge transfer gate to the charge storage locations of a CCD shift register where they are integrated.

In accordance with the invention, an optical assembly is provided including two basic units, namely a CCD photodetector arrangement, and a light modulating arrangement. The CCD photodetector arrangement comprises the known structures for linear CCD detector systems, and, in addition to the n photocells, a photocharge transfer gate and an analog CCD shift register. The light modulating arrangement comprises a charge storage register with n storage locations, a storage location selector circuit, i.e. a storage location selector, and a modulator arrangement.

The inventive method and device may be applied to uni-dimensional i.e. linear, modulable detector arrangements, to two-dimensional modulable detector arrangements, and to systems including a plurality of one-dimensional detector arrangements side by side, within the latter instance, the possibility being given to perform different transformation on one-dimensional data strings $f_n$ simultaneously.

The invention has the substantial advantage that in the manufacturing process, the modulator elements can be arranged above the photodetector photocells with a high accuracy, for example in a masking process such as known from the technology of integrated circuits. Further, any desired modulating function can be set up by writing data into the optical assembly, i.e. by a modulating signal. Moreover, the optical assembly can be reprogrammed very quickly to various transformations, for example correlations. Modulating functions once written in may be cleared within milliseconds or changed in any desired way.

Since the manufacturing costs of the inventive optical assembly do not exceed conventional prices of photodetector arrangements, and the technological application is rid of problems, a wide range is thereby opened to the practical application of optical data processing. The invention is particularly suitable for manufacturers and users of Fourier transformation systems, correlations systems, and radar data processing systems.

In accordance with the invention, there is provided an improved apparatus and method for data processing which is simple in concept and execution and inexpensive to carry out.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment is illustrated.

BRIEF DESCRIPTION OF THE DRAWING

The only FIGURE of the drawing is a schematic representation of an arrangement for carrying out the method of the invention.

DESCRIPTION OF THE PREFERRED EMBODIMENT

The single FIGURE illustrates an arrangement comprising a storage location selector circuit, i.e. a storage location selector 1 having a connection 13 for the selected address. The modulating signal 12 is supplied to this selector 1 and passes to the respective storage location, given by the selected address, of a charge storage register 2. Thereby, the potential of modulating signal 12 is stored at the selected storage location. If all n storage locations are sequentially addressed and the individual potential desired for the storage locations are applied to the modulating signal input, any desired potential variation can be stored in charge storage register 2. Modulating signal 12 varies with a second function that is to be combined with a first function to be explained later.

The n storage cells of charge storage register 2 are electrically connected to n modulator elements 4 of a modulator arrangement. The elements 4 of the modulator arrangement have the following properties:

1. Above every one of n photocells of photodetector arrangement 5, one element 4 of modulator arrangement is provided to which the potential of a cell of charge storage register 2 is supplied.

2. Every modulator element 4 is positioned to cover the entire surface area of a photodetector photocell, so that the whole light from a light source schematically shown at 3, falling on a photodetector photocell, must first pass through the respective modulator element 4. The light varies with the first function mentioned above.

3. The optical properties of modulator elements 4 are controlled through the potential of the associated cell of charge storage register 2, in a way such that the intensity of the light striking on the photodetector photocell positioned beneath modular element 4 is a function of the total intensity of the external source of light incident of the entire assembly (the first function), and a function of the voltage at the respective modulator element 4 (the second function).

4. Modulator element 4 is made of a material whose at least one property is variable by exposure to an electric field. Variable is either the coefficient of absorption, or the transmission ratio, or the polarization property.

If the coefficient of absorption or the transmission ratio are to be controlled, it may be provided to modulate directly the intensity of the light falling on the photodetector photocell. If the polarization property is to be controlled, the variations and polarization properties of the modulator elements may be converted into an intensity modulation by employing a suitable polarization equipment upstream of the optical assembly.

A suitable material for modulator elements 4 are particularly liquid crystal layers, or electro-optically active materials.

The FIGURE further indicates a photo charge transfer gate 6 having a connection 7 for a control signal. With gate 6 open, the charges produced in the photocells of photodetector arrangement 5 are delivered to the charge storage locations of a CCD shift register 8 where they are integrated. During the shifting action of CCD shift register 8, the photodetector arrangement is separated from the CCD shift register by the control signal through 7. The shift register has a connection 9 for a timing signal, and an input 10 and an output 11 for an analog signal.

In this way, the inventive optical assembly makes it possible to adjust the sensitivity of the individual photocells of the photodetector arrangement by additional read-in instructions. Further both one- and two-dimensional modulable detector arrangements may be provided, and a plurality of juxtaposed unidimensional detector arrangements may be combined to a system permitting to perform a plurality of optical transformations with a single optical assembly.

While a specific embodiment of the invention has been shown and described in detail to illustrate the application of the principles of the invention, it will be understood that the invention may be embodied otherwise without departing from such principles.

What is claimed is:

1. A method for optical data processing, comprising:
modulating a source of light according to a first function;
applying values of a second function to a storage location selector which is capable of selecting a plurality of storage locations and is further capable of writing each value of the second function as a potential value into one of the storage locations;
writing the values of the second function as potential values into a plurality of storage locations of a charge memory which storage locations has addresses that are selected by the storage location selector;
applying the potential values of the storage location to a respective plurality of optical modulator elements, each obstacle modulator element having an optical property which varies according to a potential value applied thereto;
illuminating the optical modulator elements with light from the light source which is being modulated according to the first function so that light passing through and leaving each optical modulator element has an intensity which depends on the optical property of that optical modulator element and on the modulation of the light from the light source;
illuminating a photodetector having a plurality of individual photocells with the light leaving the optical modulator element, there being an equal number of photocells and modulator elements with each modulator element being connected directly to a respective photocell, each photocell being charged to an extent dependent on the light leaving a respective modulator element and illuminating the respective photocell;
applying the photocell charges to a controlled charge transfer gate for receiving the photocell charges; and
writing the photocell charges from the controlled charge transfer gate onto individual storage locations of a CCD shift register, the photocell charges being readable from the shift register.

2. A method according to claim 1, wherein the optical property of the modulator elements which is varied comprises a coefficient of absorption for each modulator element.

3. A method according to claim 1, wherein the optical property of the modulator elements which is varied corresponds to a transmission ratio for each modulator element.

4. A method according to claim 1, wherein the optical property which is varied for the modulator elements comprises a polarization characteristic for each modulator element.

5. A device for optical data processing, comprising:

a source of light which can be modulated according to a first function;

a storage location selector for receiving a modulating signal varying according to a second function and for applying values of the second function to a plurality of storage locations;

a charge storage register connected to said storage location selector and having a plurality of storage locations each for receiving one value of the second function from the storage location selector as a potential value;

an optical modulator arrangement comprising a plurality of modulator elements equal in number to said plurality of storage locations and each connected to a storage location for receiving a potential value from a respective storage location, each modulator element having an optical property which is variable with a potential value, said optical modulator arrangement being positioned so as to receive modulated light from said light source so that light passing through and leaving each modulator element varies according to the first and the second functions;

a photodetector having a plurality of photocell pixles, each modulator element being disposed on a respective pixle for applying light leaving each modulator element to the respective pixle, each pixle being chargeable to a level corresponding to light leaving each respective modulator element;

a photocharge transfer gate connected to said photodetector for receiving and transferring each charge; an a charge storage shift register connected to said transfer gate for receiving and storing each transfer charge.

6. A device according to claim 5, wherein each modulator element comprises a liquid crystal element.

* * * * *